(12) United States Patent
Delorme et al.

(10) Patent No.: US 10,725,067 B2
(45) Date of Patent: Jul. 28, 2020

(54) LOW-POWER ACCELEROMETER

(71) Applicants: Nicolas Pierre Delorme, Grenoble (FR); Daniel Saias, Grenoble (FR)

(72) Inventors: Nicolas Pierre Delorme, Grenoble (FR); Daniel Saias, Grenoble (FR)

(*) Notice: Subject to any disclaimer, the term of this patent is extended or adjusted under 35 U.S.C. 154(b) by 100 days.

(21) Appl. No.: 16/092,728

(22) PCT Filed: Apr. 5, 2017

(86) PCT No.: PCT/FR2017/050803
§ 371 (c)(1),
(2) Date: Oct. 10, 2018

(87) PCT Pub. No.: WO2017/178732
PCT Pub. Date: Oct. 19, 2017

(65) Prior Publication Data
US 2019/0128918 A1    May 2, 2019

(30) Foreign Application Priority Data

Apr. 12, 2016  (FR) ...................................... 16 53228

(51) Int. Cl.
*G01P 15/00* (2006.01)
*G01P 15/135* (2006.01)
(Continued)

(52) U.S. Cl.
CPC ........ *G01P 15/135* (2013.01); *G01P 15/0802* (2013.01); *H01H 35/14* (2013.01);
(Continued)

(58) Field of Classification Search
CPC .......... G01P 15/135; G01P 2015/0837; G01P 15/0802; G01P 2015/0851; H01H 35/14
(Continued)

(56) References Cited

U.S. PATENT DOCUMENTS

| 8,952,466 B2* | 2/2015 | Classen ................. B81B 3/0018 |
| | | 257/415 |
| 2005/0126288 A1* | 6/2005 | Gahn ....................... G01P 15/08 |
| | | 73/504.12 |
| 2019/0187170 A1* | 6/2019 | Painter .................. G01P 15/125 |

FOREIGN PATENT DOCUMENTS

| WO | 9527217 A1 | 10/1995 |
| WO | 2016087073 A1 | 6/2016 |

OTHER PUBLICATIONS

ISA/EPO, International Search Report for International Application No. PCT/FR2017/050803, dated Jul. 12, 2017, 15 pages.

(Continued)

*Primary Examiner* — Jamel E Williams

(57) ABSTRACT

The invention relates to an accelerometer comprising a plurality of proof-masses (M1-M4) moveable along a measurement axis (AB); a respective spring (K1-K4) rigidly attached to each proof-mass, configured to exert an elastic recall on the proof-mass in the measurement axis; a fixed stop (S1-S4) associated with each proof-mass, arranged to intercept the proof-mass when the acceleration in the measurement axis increases by a step; and an electrical contact associated with each stop, configured to be closed when the associated proof-mass reaches the stop. The proof-masses are suspended in series with respect to one another by springs in the measurement axis, the stops being arranged to successively intercept the respective proof-masses for increasing thresholds of acceleration.

9 Claims, 3 Drawing Sheets

(51) Int. Cl.
  *H01H 35/14* (2006.01)
  *G01P 15/08* (2006.01)
  *H01H 1/00* (2006.01)

(52) U.S. Cl.
  CPC ............... *B81B 2201/0235* (2013.01); *G01P 2015/0837* (2013.01); *G01P 2015/0851* (2013.01); *G01P 2015/0871* (2013.01); *H01H 1/0036* (2013.01)

(58) Field of Classification Search
  USPC ..................................................... 73/514.38
  See application file for complete search history.

(56) References Cited

OTHER PUBLICATIONS

Kumar, Varun, et al., "Ultra-Low Power Self-Computing Binary Output Digital MEMS Accelerometer," 2016 IEEE 29th International Conference on Micro Electro Mechanical Systems (MEMS), Shanghai, 2016, pp. 251-254.

\* cited by examiner

Fig 3
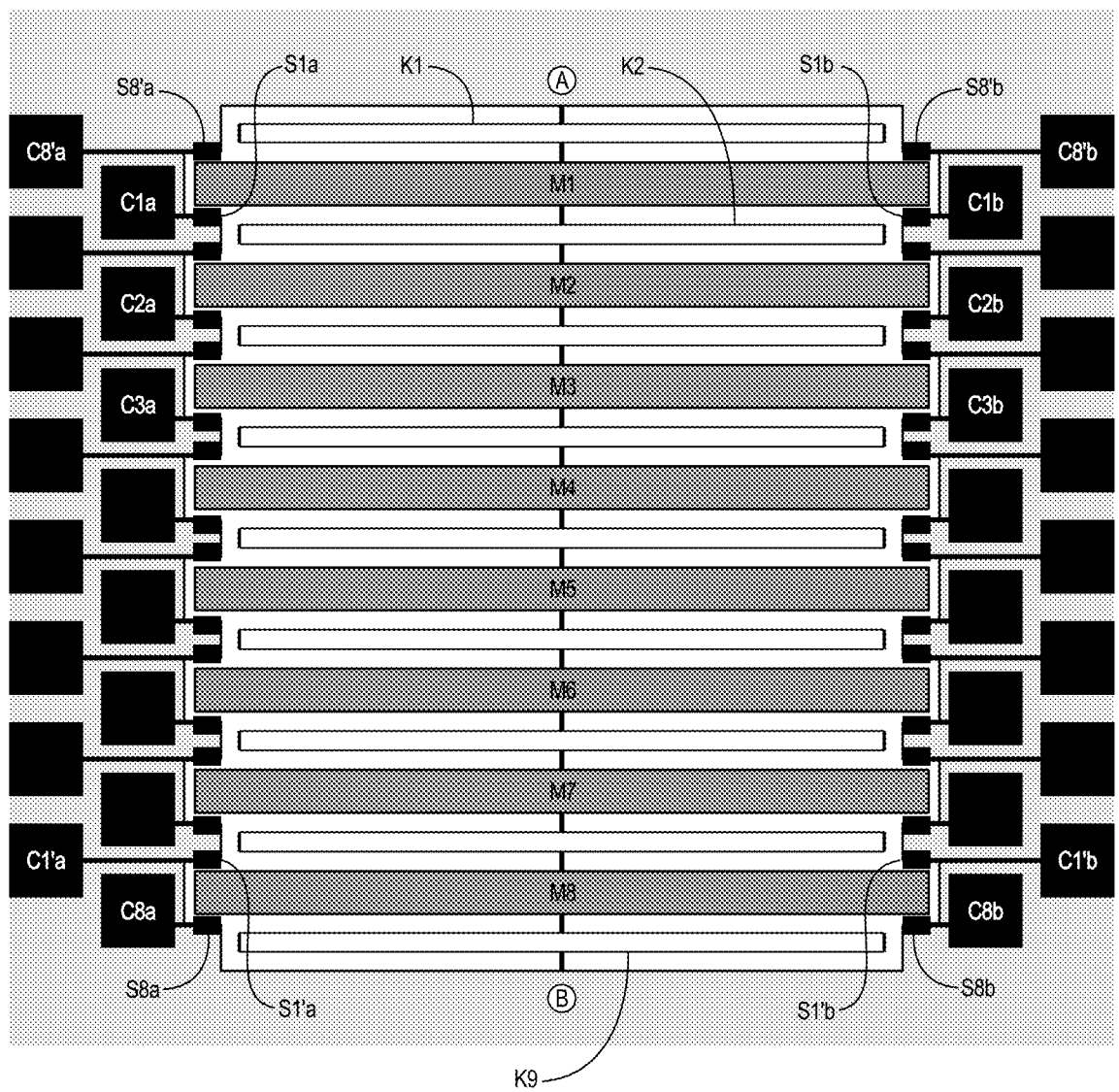
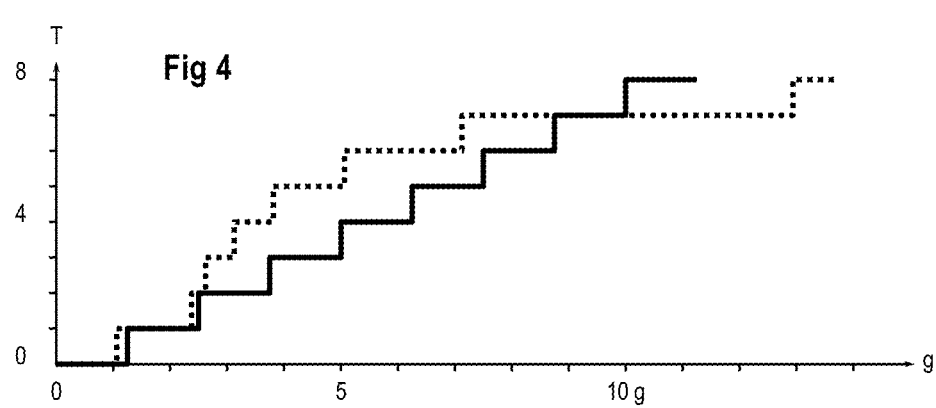
Fig 4

LOW-POWER ACCELEROMETER

FIELD

The invention relates to accelerometers, and more specifically to accelerometers manufactured in MEMS technology.

BACKGROUND

MEMS accelerometers typically use proof-masses whose displacement is measured by capacitive effect. In order to measure a capacitance, analog components operating at a high frequency are often used. Such components consume significant power. The power consumption of the analog components in a MEMS accelerometer can represent more than 80% of the total consumption.

The article [Varun Kumar et al., "Ultra-Low Power Self-Computing Binary Output Digital MEMS Accelerometer", MEMS 2016, Shanghai, CHINA, 24-28 January 2016] discloses a MEMS accelerometer producing a binary output, including as many proof-masses as bits to produce. Each proof-mass is suspended from a fixed wall by a spring and is associated with a stop that the proof-mass contacts when the acceleration is sufficient. The stop and the proof-mass are metal-coated, so that the pressure of the proof-mass on the stop closes an electrical contact to represent a binary "1".

The proof-masses have the same weight and the stiffness constants of the springs follow a geometric progression of ratio 2. With this configuration, a given proof-mass reaches its respective stop under an acceleration twice that causing the previous proof-mass to reach its respective stop. In order to make the provided code binary, the article proposes associating electrostatic actuators to the proof-masses, controlled to lift each proof-mass from its respective stop when a higher rank proof-mass reaches its respective stop.

Such a binary accelerometer, although it does not use analog components to exploit the signal, requires some electrical power to control the actuators. In addition, it is difficult to size the actuators and to produce springs in MEMS technology that have sufficiently accurate stiffnesses following a geometric progression.

SUMMARY

An accelerometer is generally provided comprising a plurality of proof-masses movable along a measurement axis; a respective spring attached to each proof-mass, configured to exert an elastic return on the proof-mass along the measurement axis; a fixed stop associated with each proof-mass, arranged to intercept the proof-mass when the acceleration along the measurement axis increases by one step; and an electrical contact associated with each stop, configured to be closed when the associated proof-mass reaches the stop. The proof-masses are suspended with respect to one and other by the springs, in series along the measurement axis, and the stops are configured to successively intercept the respective proof-masses for increasing acceleration thresholds.

Each of the first and last proof-masses of the series may be suspended to a fixed point by a spring.

The stops may be arranged to intercept alternately a proof-mass of rank decreasing from the last rank of the series and a proof-mass of rank increasing from the first rank of the series.

The accelerometer may comprise two stops per proof-mass, a first of the two stops being arranged to intercept the proof-mass in a first direction of travel along the measurement axis, and the second stop being arranged to intercept the proof-mass in the opposite direction of travel.

The accelerometer may comprise a pair of stops for each proof-mass, the two stops of the pair being arranged at opposite ends of the proof-mass transversely to the measurement axis.

Each proof-mass and its two stops may be configured to close the respective electrical contact when the proof-mass rests simultaneously on the two stops.

The two stops of a pair associated with a proof-mass may, on the contrary, be offset relative to each other along the measurement axis.

The proof-masses may have the same weight and the springs have the same stiffness constant.

The proof-masses and springs may be integrally made of silicon, the proof-masses having a shape factor elongated transversely to the measurement axis, and the springs being leaf springs transverse to the measuring axis.

BRIEF DESCRIPTION OF DRAWINGS

Other advantages and features will become more clearly apparent from the following description of particular embodiments of the invention provided for exemplary purposes only and represented in the appended drawings, in which:

FIG. 3 represents to scale a detailed embodiment of a unary code accelerometer according to the principle of FIGS. 2A to 2D, produced using MEMS technology;

FIG. 4 is a graph illustrating the response of the accelerometer of FIG. 3 for two series of spacings of the stops.

DESCRIPTION OF EMBODIMENTS

It is sought herein to achieve an accelerometer providing, like that of the aforementioned article by Varun Kumar, discrete acceleration measurements through the states of mechanical switches. It is further desired that the accelerometer be fully passive and present few design difficulties for providing a reliable measurement.

Figures 1A, 1B, 1C, 1D:
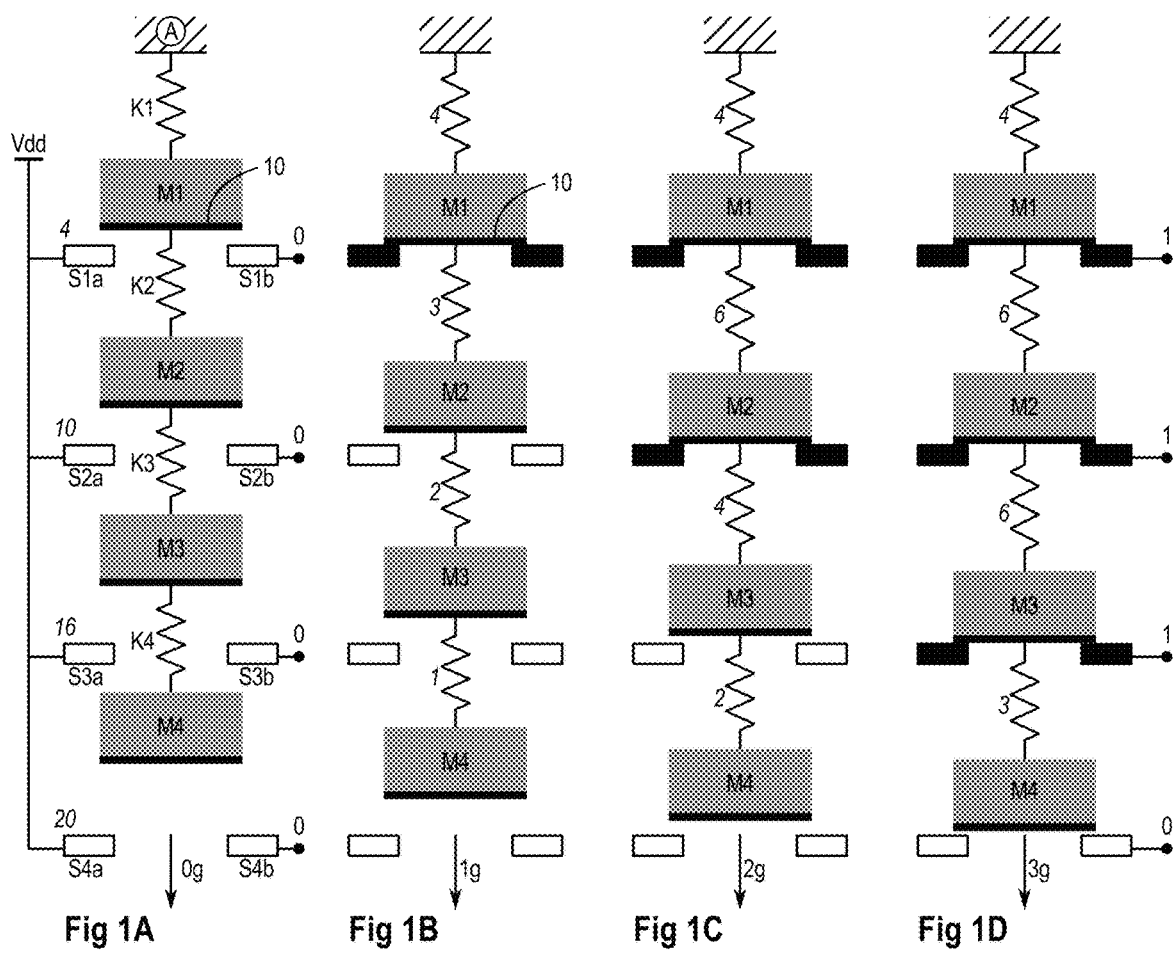
FIGS. 1A to 1D are schematic diagrams of a first embodiment of a unary code accelerometer, in configurations resulting from different acceleration values.

FIG. 1A is an operating diagram of a first embodiment of such an accelerometer, in a rest position, that is to say under zero acceleration denoted 0 g. It comprises several proof-masses, here four, M1 to M4, suspended from each other in series along the axis of the acceleration to be measured, here the north-south axis. Each proof-mass is suspended from the previous by a respective spring K1 to K4, the first proof-mass M1 being suspended from a fixed point A by the spring K1.

Each proof-mass Mi is associated with a conductive stop Sia arranged to intercept the proof-mass in a direction of travel along the measurement axis, here to the south. Since the proof-masses are free to rotate, it is preferred to provide a pair of stops Sia, Sib for each proof-mass, on either side of the measurement axis, that prevent the proof-mass from rotating.

The two conductive stops Sia and Sib associated with a proof-mass Mi form two terminals of a mechanical switch. The proof-mass Mi includes a conductive zone 10 opposite the stops, which electrically connects the two stops when the proof-mass rests thereon. As shown, the stops Sia may be supplied by a common voltage Vdd corresponding, for example, to the logic level "1". The stops Sib then form terminals from which the level of acceleration is taken according to a unary code. The unary code may be linear or other depending on the choice of the spacings of the stops relative to the rest positions of the proof-masses.

The proof-masses may all have the same weight m and the springs the same stiffness constant k. Assuming that mg/k=1, a spring K extends by 1 for an acceleration of 1 g (where g is the gravitational constant). An example of spacings for the stops S1a to S4a is indicated in FIG. 1A, namely 4, 10, 16 and 20, providing in these conditions a linear unary code for an acceleration of 0 to 4 g.

FIG. 1B illustrates the configuration of the accelerometer subjected to an acceleration of 1 g towards the south. The springs K1 to K4 extend by 4, 3, 2 and 1 respectively. The proof-mass M1 comes to rest on the stops S1a and S1b, closing the corresponding switch, which is illustrated by stops in black. The accelerometer indicates an acceleration of 1 g by the unary code 0001 taken from the stops S1b to S4b.

FIG. 1C illustrates the configuration of the accelerometer subjected to an acceleration of 2 g towards the south. The proof-mass M1 being blocked, the spring K1 no longer extends. The springs K2 to K4 continue to extend and their elongations reach respectively 6, 4 and 2. The proof-mass M2 comes to rest on the stops S2a and S2b, closing the corresponding switch. The accelerometer indicates an acceleration of 2 g by the unary code 0011 taken from the stops S1b to S4b.

FIG. 1D illustrates the configuration of the accelerometer subjected to an acceleration of 3 g towards the south. The proof-masses M1 and M2 being blocked, the springs K1 and K2 no longer extend. The springs K3 and K4 continue to extend and their elongations reach respectively 6 and 3. The proof-mass M3 comes to rest on the stops S3a and S3b, closing the corresponding switch. The accelerometer indicates an acceleration of 3 g by the unary code 0111 taken from the stops S1b to S4b.

When the accelerometer is subjected to 4 g, the last proof-mass M4 comes to rest on the stops S4a and S4b, the spring K4 reaching an elongation of 4. The unary code then displays 1111.

The total elongation of the system is 20, corresponding to the spacing between the last pair of stops S4a, S4b and the rest position of the last proof-mass M4.

Figures 2A, 2B, 2C, 2D:
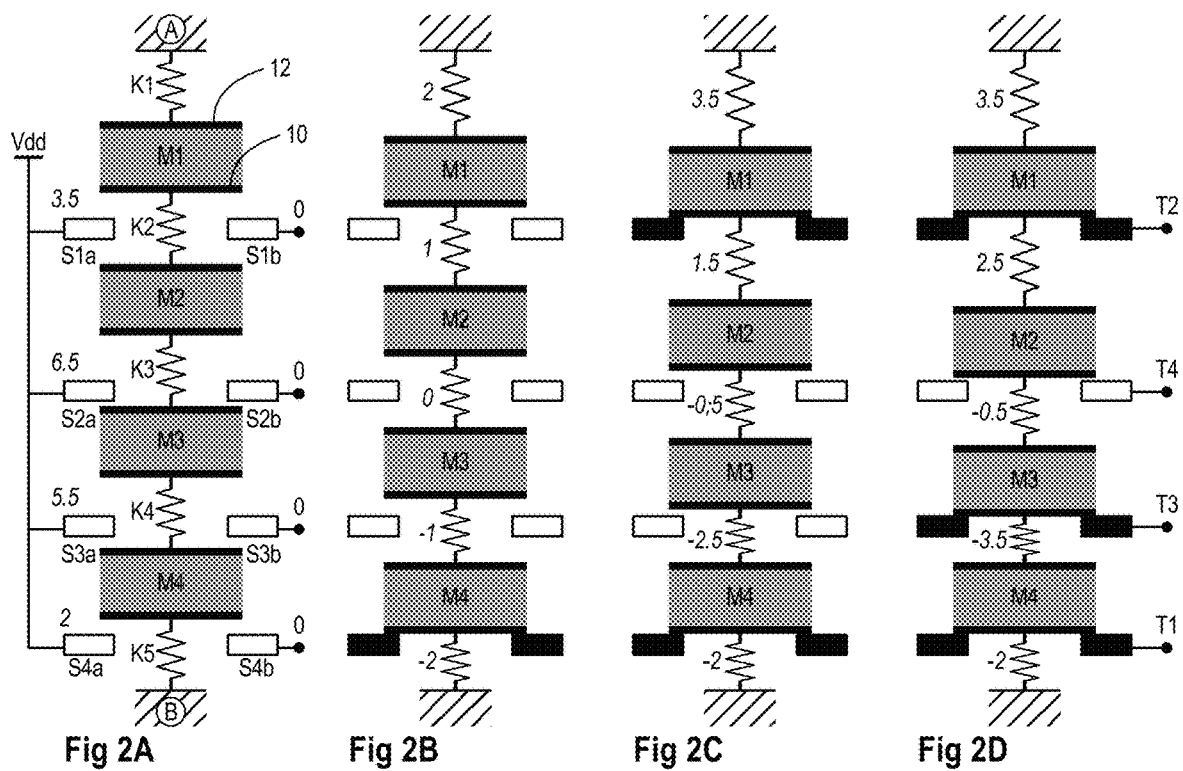
FIGS. 2A to 2D are schematic diagrams of a second embodiment of a unary code accelerometer, in configurations resulting from different acceleration values.

FIG. 2A is an operation diagram of a second embodiment of a unary code accelerometer suited for measuring accelerations that can be in both directions along the measurement axis. Compared with the previous embodiment, the last proof-mass M4 is connected to a fixed point B by an additional spring K5 that may have the same stiffness constant as the other springs. Points A and B define the measurement axis of the acceleration, denoted AB. The structure thus behaves symmetrically with respect to the two directions of acceleration, from A to B and from B to A.

Assuming again that mg/k=1, it can be calculated that the elongations of the springs under an acceleration of 1 g are respectively 2, 1, 0, −1, −2 for the springs K1 to K5. A negative elongation means that the spring is compressed. In general, for a system with N proof-masses and N+1 springs, the elongations are N/2, N/2−1, N/2−2, . . . N/2−i . . . −N/2+i . . . −N/2.

FIG. 2B illustrates the configuration of the accelerometer subjected to an acceleration of 1 g from A to B. As indicated above, the springs K1 to K5 respectively extend by 2, 1, 0, −1, −2. The spacings of the stops are chosen here so that the last proof-mass M4 is intercepted first.

In fact, the stops are configured to alternately intercept a proof-mass of decreasing rank (starting from the last rank of the series) and a proof-mass of increasing rank (starting from the first rank of the series). This configuration limits the elongation of the springs. The choice of the starting proof-mass (the last or the first) is indifferent. To produce the unary code, the ranks of the stops S1b to S4b are reorganized. The unary code is taken in the order of terminals T1 to T4, which respectively correspond to the stops S4b, S1b, S3b and S2b.

Thus, the proof-mass M4 comes to rest on the stops S4a and S4b, closing the corresponding switch, which is illustrated by stops in black. The accelerometer indicates an acceleration of 1 g by the unary code 0001 taken from terminals T1 to T4. The stops S4a and S4b thus have a spacing of 2 relative to the rest position of the proof-mass M4.

FIG. 2C illustrates the configuration of the accelerometer subjected to an acceleration of 2 g towards the south. The proof-mass M4 being blocked, the spring K5 is no longer operative. The system now only includes 3 proof-masses and 4 springs. The springs K1 to K4 continue to operate and their elongations respectively reach 3.5, 1.5, −0.5 and −2.5. The proof-mass M1 comes to rest on the stops S1a and S1b, closing the corresponding switch. The accelerometer indicates an acceleration of 2 g by the unary code 0011 taken from the terminals T1 to T4. The stops S1a and S1b thus have a spacing of 3.5 relative to the rest position of the proof-mass M1.

FIG. 2D illustrates the configuration of the accelerometer subjected to an acceleration of 3 g towards the south. The proof-masses M1 and M4 being blocked, the springs K1 and K5 no longer deform. The system now only includes 2 proof-masses and 3 springs. The springs K2 to K4 continue to deform and their elongations reach respectively 2.5, −0.5 and −3.5. The proof-mass M3 comes to rest on the stops S3a and S3b, closing the corresponding switch. The accelerometer indicates an acceleration of 3 g by the unary code 0111 taken from the terminals T1 to T4. The stops S3a and S3b thus have a spacing of 5.5 with respect to the rest position of the proof-mass M3.

When the accelerometer is subjected to 4 g, the proof-mass M2 comes to rest on the stops S2a and S2b, the springs K2 and K3 reaching respective elongations of 3 and −1. The unary code then displays 1111. The stops S2a and S2b thus have a spacing of 6.5 relative to the rest position of the proof-mass M2.

To measure an acceleration in the opposite direction (B to A), the system will comprise a second set of stops (not shown) symmetrical to the first set of stops, cooperating with the upper sides of the proof-masses. The upper sides of the proof-masses may thus have, as shown, a conductive zone 12.

The proof-masses subjected to the largest travel are those near the center, the maximum travel in this example being 6.5 for the proof-mass M2.

Such a unary code accelerometer provides a state representative of the acceleration without consuming current. The accelerometer operating circuitry, which may be entirely digital, is then designed to apply a voltage representative of the logic state "1" (for example Vdd) to the conductive stops Sia and to retrieve the logic states present on the terminals T1 to T4.

In the field, the accelerometer may be subjected to impacts and off-axis acceleration components that transiently make the proof-masses bounce on the stops, causing intermittent electrical contact. The fact of providing two stops per proof-mass operates a pre-filtering of such rebounds, in that the state 1 of a corresponding bit is confirmed only if the proof-mass rests simultaneously on both stops. The fact that the code is unary offers additional filtering, in that the code is only confirmed if all the bits of lower rank are at 1.

FIG. 3 shows to scale a detailed embodiment of a unary code accelerometer according to the principle of FIG. 2A, produced using MEMS technology. The proof-masses and springs are etched in a silicon substrate using a technology that allows the formation of trenches and the removal of material under the etched structure. The etched structure here comprises eight proof-masses M1 to M8 and nine springs K1 to K9, the springs K1 and K9 connecting the structure to the fixed substrate at A and B. In this embodiment, the proof-masses have an elongated form factor transverse to the measuring axis AB. The springs are leaf springs transverse to the measuring axis. The pairs of conductive stops are structured in the walls of the well housing the proof-masses and the springs. Two sets of pairs of stops are shown, namely a set Sia, Sib (where i varies from 1 to 8) cooperating with the bottom sides of the proof-masses and used to measure an acceleration from A to B, and a set Si'a, Si'b cooperating with the upper sides of the proof-masses and used to measure an acceleration from B to A. Each conductive stop is individually accessible by a contact pad Cia, Cib, Ci'a, or Ci'b.

As an example, the structure has a thickness of 50 micrometers. Each proof-mass has a width of 800 micrometers and a length of 10 micrometers (in the direction of the axis of measurement). The leaf springs have a length of 350 micrometers and a width of 1 micrometer. Each spring comprises four blades in a parallel-series configuration symmetrical with respect to the axis AB. FIG. 3 is shown at the scale of these dimensions.

When using the system as illustrated in FIGS. 2A to 2D, that is to say by arranging the stops to intercept alternately the upper and lower proof-masses, and assuming mg/k=1, the following series of normalized spacings is obtained for the eight pairs of stops in the order of ranks 1 to 8:

| 7.5 | 18.5 | 29 | 35 | 33 | 24.5 | 13.5 | 4 |

These spacings are defined to increment the unary code by one step for each 1 g acceleration step, in other words to obtain a linear unary code. In the silicon structure of FIG. 3, with the dimensions indicated, the following series of spacings, in micrometers, may be considered. These spacings are illustrated substantially to scale in FIG. 3.

| 1.1 | 2.65 | 4.2 | 5.07 | 4.78 | 3.55 | 1.95 | 0.58 |

With these values, proportional to the normalized values above, a linear unary code is obtained on a scale of 0 to 10 g. Each value of the unary code then corresponds to an acceleration step of 1.25 g. It is recalled that the unary code is formed in the order of interception of the proof-masses when the acceleration increases, here 8-1-7-2-6-3-5-4, which is different from the order of the positions of the proof-masses (1 to 8).

FIG. 4 is a graph illustrating the response of the accelerometer of FIG. 3 for two sets of spacings of the stops. The solid line response curve corresponds to the above spacings, providing a linear response.

The spacings may however be defined with some freedom by the designer, depending on the type of response desired or the resolution of the technology. The dotted-line curve corresponds to the following linear series of spacings (in micrometers):

| 1 | 2 | 3 | 4 | 3.5 | 2.5 | 1.5 | 0.5 |

These values provide a non-linear, yet monotonic response, substantially in "S".

In the previous figures, the two stops of each pair are arranged at the same distance from the corresponding proof-mass, and it is only if the proof-mass rests on both stops simultaneously that the electrical contact is closed.

In FIGS. 5A to 5D, the second stop of each pair is shifted relative to the first. The accelerometer shown, of the type of FIG. 1B as an example, has only two proof-masses.

Figure 5A:
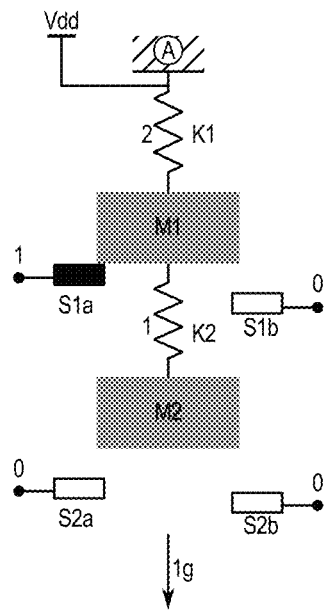
FIGS. 5A to 5D are schematic diagrams of an alternative unary code accelerometer, in configurations resulting from different acceleration values.

In FIG. 5A, the accelerometer is subjected to an acceleration of 1 g towards the south. The springs K1 and K2 elongate respectively by 2 and 1. The proof-mass M1 only reaches the stop S1a. This contact establishes a first value of the unary code. To thus detect a contact with a single stop, the set of springs and proof-masses may be conductive and supplied at voltage Vdd, as shown. In the context of a MEMS technology, the silicon structure of the proof-masses can be made conductive by doping.

Figure 5B:
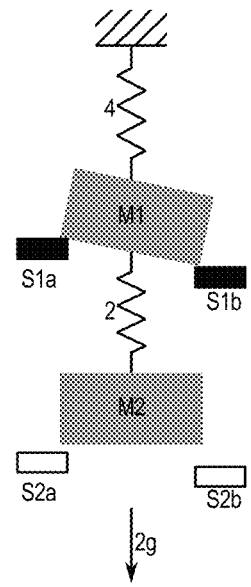

In FIG. 5B, the accelerometer is subjected to an acceleration of 2 g. The proof-mass M1 continues its motion, rotating around its contact point on the stop S1a, whereby its free end moves twice as fast as its center. The springs K1 and K2 reach respective elongations of 4 and 2. The stop S1b is placed to be reached in this configuration by the moving end of the proof-mass M1 and establish the second value of the unary code. The stop S1b is thus shifted southward by 4 relative to the stop S1a.

Figure 5C:
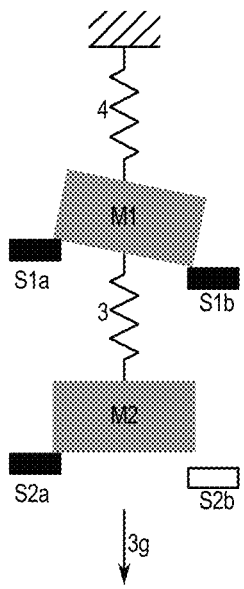

In FIG. 5C, the accelerometer is subjected to an acceleration of 3 g. The proof-mass M1 is blocked, so that the spring K1 no longer extends. The spring K2 reaches an elongation of 3. The stop S2a is arranged to be reached in this configuration by the proof-mass M2 and establish the third value of the unary code.

Figure 5D:
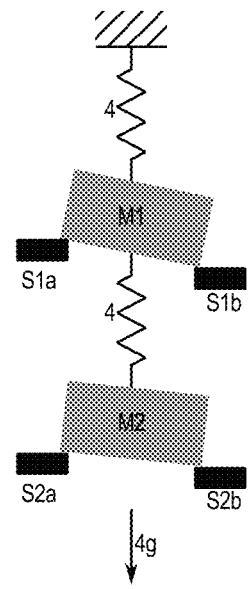

In FIG. 5D, the accelerometer is subjected to an acceleration of 4 g. The proof-mass M2 continues southward, rotating around its point of contact on the stop S2a. The spring K2 reaches an elongation of 4. The stop S2b is arranged to be reached in this configuration by the moving end of the proof-mass M2 and establish the fourth value of the unary code. The stop S2b is thus shifted southward by 2 relative to stop S2a.

With this accelerometer configuration, the resolution of the unary code is doubled for a given number of proof-masses and springs. The rotation of the proof-masses has been exaggerated in FIGS. 5B to 5D, which are schematic. When applying this arrangement with offset stops in a real structure, like that of FIG. 3, the rotation of the proof-masses is barely noticeable given the elongated form factor of the proof-masses and the small spacings of the stops.

The fact that the proof-masses and the springs are physically identical in the examples described simplifies the design of the accelerometer and guarantees the reproducibility of the response of the accelerometer in a mass production. In fact, it is easier, in a same device, to produce elements having the same characteristics (mass, stiffness constant) than elements having to respect a ratio of characteristics (ratios 2 and 4 between the stiffness constants in the aforementioned article by Varun Kumar). Of course, the proof-masses and springs may have different characteristics if this meets needs of the designer.

The invention claimed is:

1. An accelerometer comprising:
   a plurality of proof-masses movable along a measurement axis;
   a respective spring attached to each proof-mass, configured to exert an elastic return on the proof-mass along the measurement axis;
   a fixed stop associated with each proof-mass, arranged to intercept the proof-mass when the acceleration along the measurement axis increases by one step; and
   an electrical contact associated with each stop, configured to be closed when the associated proof-mass reaches the stop;
   wherein the proof-masses are suspended with respect to one and other by the springs, in series along the measurement axis, and the stops are configured to successively intercept the respective proof-masses for increasing acceleration thresholds.

2. The accelerometer according to claim 1, wherein each of the first and last proof-masses of the series is suspended to a fixed point by a spring.

3. The accelerometer according to claim 2, wherein the stops are arranged to intercept alternately a proof-mass of rank decreasing from the last rank of the series and a proof-mass of rank increasing from the first rank of the series.

4. The accelerometer according to claim 2, comprising two stops per proof-mass, a first of the two stops being arranged to intercept the proof-mass in a first direction of travel along the measurement axis, and the second stop being arranged to intercept the proof-mass in the opposite direction of travel.

5. The accelerometer according to claim 1, comprising a pair of stops for each proof-mass, the two stops of the pair being arranged at opposite ends of the proof-mass transversely to the measurement axis.

6. The accelerometer according to claim 5, wherein each proof-mass and its two stops are configured to close the respective electrical contact when the proof-mass rests simultaneously on the two stops.

7. The accelerometer according to claim 5, wherein the two stops of a pair associated with a proof-mass are offset relative to each other along the measurement axis.

8. The accelerometer according to claim 1, wherein the proof-masses have the same weight and the springs have the same stiffness constant.

9. The accelerometer according to claim 2, wherein the proof-masses and springs are integrally made of silicon, the proof-masses having a shape factor elongated transversely to the measurement axis, and the springs being leaf springs transverse to the measuring axis.

* * * * *